United States Patent [19]

Park

[11] Patent Number: 5,087,323

[45] Date of Patent: Feb. 11, 1992

[54] FINE LINE PATTERN FORMATION BY AEROSOL CENTRIFUGE ETCHING TECHNIQUE

[75] Inventor: Jin Y. Park, Moscow, Id.

[73] Assignee: Idaho Research Foundation, Inc., Moscow, Id.

[21] Appl. No.: 551,925

[22] Filed: Jul. 12, 1990

[51] Int. Cl.$^5$ .................. H01L 21/306; B44C 1/22; C03C 15/00; C03C 25/06

[52] U.S. Cl. ........................ 156/646; 156/639; 156/640; 156/657; 156/659.1; 156/345

[58] Field of Search ............. 156/626, 637, 638, 639, 156/640, 646, 653, 657, 659.1, 662, 345; 252/79.3; 134/99, 102, 145, 149, 198

[56] References Cited

U.S. PATENT DOCUMENTS

| | | | |
|---|---|---|---|
| 3,459,586 | 8/1969 | Kiwiet et al. | 117/96 |
| 3,990,462 | 11/1976 | Elftmann et al. | 134/102 |
| 4,127,437 | 11/1978 | Bersin et al. | 156/635 |
| 4,132,567 | 1/1979 | Blackwood | 134/1 |
| 4,175,469 | 11/1979 | Ritland et al. | 89/1 |
| 4,300,581 | 11/1981 | Thompson | 134/57 |
| 4,359,360 | 11/1982 | Harris et al. | 156/345 |
| 4,468,283 | 8/1984 | Ahmed | 156/642 |
| 4,609,575 | 9/1986 | Burkman | 427/426 |
| 4,664,133 | 5/1987 | Silvernail et al. | 134/99 |
| 4,682,614 | 7/1987 | Silvernail et al. | 134/99 |
| 4,830,084 | 5/1989 | Singer | 164/46 |

OTHER PUBLICATIONS

"Aerosol Jet Etching of Fine Patterns", by Y. L. Chen, J. R. Brock and I. Trachtenberg, Appl. Phys., Lett. 51 (26), 28, Dec. 1987, pp. 2203-2205.

"Aerosol Jet Etching of Hg$_{1-x}$Cd$_x$Te", by B. J. Jurcik, Jr., J. R. Brock, and I. Trachtenberg (believed to be as yet Unpublished).

"Aerosol Jet Etching", by Y. L. Chen, J. R. Brock, and I. Trachtenberg, *Aerosol Science & Technology*, vol. 12, pp. 842-855, Aug. 1990.

*Primary Examiner*—William A. Powell
*Attorney, Agent, or Firm*—Klarquist, Sparkman, Campbell, Leigh & Whinston

[57] ABSTRACT

A wafer etching system for forming a fine line pattern on a wafer of a semiconductive material having an etchable film layer with an outer surface being divided by masking into exposed regions and masked regions includes an etchant vapor supply system for producing an etchant vapor of an etchant reactable with the etchable film layer. The system also includes an aerosol centrifuge etching device, including an expansion nozzle for adibatically expanding the etchant vapor received from the supply system to form therefrom etchant aerosols. The aerosol centrifuge etching device also includes a centrifuge which receives and uniformly accelerates the received etchant aerosols with a centrifugal force toward the wafer to be etched. The aerosol centrifuge etching device further includes mounting means for mounting the wafer within the centrifuge so the etchant aerosols may impinge upon the outer surface of the wafer and etch away the exposed regions of the etchable film layer. A method is also provided of using the aerosol centrifuge etching device and system for forming fine line patterns on wafers.

29 Claims, 4 Drawing Sheets

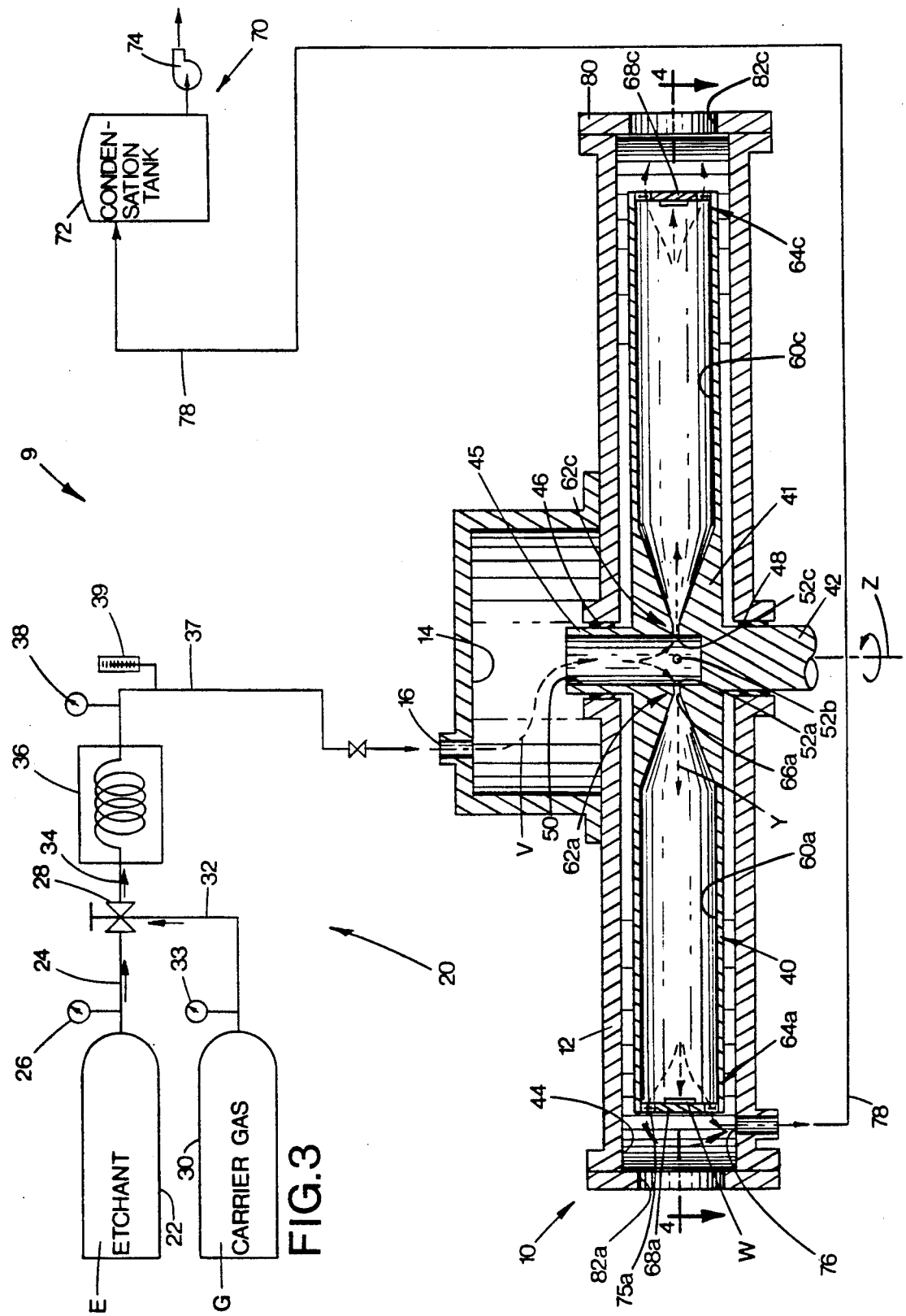

FINE LINE PATTERN FORMATION BY AEROSOL CENTRIFUGE ETCHING TECHNIQUE

BACKGROUND OF THE INVENTION

The present invention relates generally to an etching system for etching wafers of a semiconductor material, such as may be used in the fabrication of integrated circuits, and more particularly to an improved system using an aerosol centrifuge etching (ACE) technique.

In one known method of fabricating integrated circuits, a wafer having a semiconductive substrate layer and an outer oxide film layer is prepared for etching in the following manner. An etchant reactable with the oxide film, but not with the semiconductor substrate layer, is selected. A polymer coating is placed over the oxide layer. The polymer chosen is resistant to the selected etchant until exposed to ultraviolet (UV) light. A mask defining a fine line pattern is placed over the polymer coating, and the wafer is exposed to a UV light source to form a pattern in the polymer coating of irradiated etchable regions and shielded nonetchable. The mask is then removed from the wafer.

During etching of the prepared wafer, the etchant removes the exposed regions of the polymer coating and the oxide film layer beneath these regions while, in theory, the masked regions of the polymer coating shield the oxide film layer therebeneath from being removed by the etchant. After etching, the remaining polymer coating is removed. Ideally, the etched wafer has a contoured pattern of raised lands or plateaus of the oxide film separated by depressions extending downwardly to the semiconductive substrate layer. Fabrication may be continued by placing an additional oxide film layer or a semiconductive material layer, such as that doped with positive or negative ions, over the etched surface. The coating, masking and etching steps may then be repeated. In this manner, the layers of an integrated circuit wafer may be formed.

Several known dry etching techniques capable of a high fidelity transfer of fine line patterns may be used in the fabrication of integrated circuits, and particularly in the manufacture of large industrial wafers, such as very large scale integrated (VLSI) and ultra large scale integrated (ULSI) circuits. For example, ion beam milling and sputter etching are each nonreactive dry etching techniques which are anisotropic, that is, possessing a high degree of directionality. However, dry etching methods have a low selectivity, that is, the etching proceeds beyond the desired region into the substrate layer and into the masked regions of the polymer layer. This low selectivity renders the dry techniques particularly unsuitable for etching multilayer wafers.

Another dry etching technique is plasma etching, wherein certain activated gaseous species generated in plasma are applied to a patterned surface to etch the wafer. Plasma etching is anisotropic and has improved selectivity over the ion beam milling and sputter etching techniques. Presently, plasma etching is the dominant technique for use in VLSI fabrication. However, plasma etching suffers from several disadvantages, such as radiation damage to the finished product, the production of contaminants, process control problems, and high cost.

Another known etching technique which may be used in the fabrication of integrated circuits is wet chemical etching. Wet chemical etching is a conventional technique wherein the prepared wafers to be etched are dipped in a bath of etchant liquid. The conductive currents within the etchant liquid transport the etchant to and the reaction products from the wafer. The wet etching technique has several advantages over the plasma etching technique, including lower cost, ease of control, versatility and higher selectivity than plasma etching.

The wet etching technique suffers from several disadvantages, such as contamination of the etchant liquid from contaminants introduced into the bulk liquid etchant. However, the most severe limitation of wet etching is the incapability of the technique to produce extremely fine line patterns in wafers, such as those required in the fabrication of VLSI circuit wafers. This limitation stems from a lack of anisotropy, which is manifested as undercutting.

In the ideal case, the etching of a prepared wafer proceeds in a direction normal to the polymer outer surface, forming a trough with straight sidewalls. However in practice, due to the isotropic nature of the region between the wet chemical etchant and the material being etched, the etching reaction also proceeds outwardly into the sidewalls of the trough being etched. This results in the etchant removing portions of the oxide layer beneath the masked regions of the polymer coating.

For example, the wet etching technique is illustrated in FIGS. 1(a) through 1(d) by cross sectional views of a wafer W being etched. In FIG. 1(a), a prepared wafer W is shown having a semiconductive substrate layer S over which an etchable oxide film layer X has been formed. An irradiated polymer coating layer P having an outer surface F covers the oxide layer X. The irradiated polymer layer P has plural nonetchable regions M which were covered by a mask during irradiation, and plural irradiated etchable regions R which have been irradiated by exposure to a UV light source.

In FIG. 1(b), the etchant liquid L is shown etching through the irradiated regions R of the polymer layer P. In FIG. 1(c), the liquid etchant L is shown etching downwardly through the oxide layer X to form a trough T. The etchant L undercuts the sidewalls of trough T, as indicated by the letter U, with the undercutting extending under the nonetchable, masked region M of the polymer layer P.

FIG. 1(d) illustrates the final product upon completion of the wet etching process. Due to the undercutting, plateaus remain which have only minimal amounts of the oxide layer X. The minimal cross sectional area of oxide layer X may cause excessive heating of the finished product during use, with a subsequent decrease in the reliability of the finished product. In the extreme case, as the distance between two adjacent troughs is decreased, the two troughs may actually merge. Thus, fine line pattern formation in submicron size, as required for VLSI and ULSI wafers, is extremely difficult using wet etching.

Another etching technique has been proposed by researchers at the University of Texas, and is referred to as Aerosol Jet Etching (AJE). See Y. Chen, J. Brock and I. Trachtenberg, "Aerosol Jet Etching of Fine Patterns," *Applied Physics Letters*, Vol. 51, No. 26, pp. 2203–05 (American Institute of Physics, 1987). In the AJE process, a gas which contains an etchant vapor is adiabatically expanded by an expansion nozzle to form fine droplets or aerosols of etchant. A aerosol jet having a conical pattern with a central jet axis is formed upon leaving the expansion nozzle. A surface to be etched is located a spaced-apart distance away from the expansion nozzle outlet and positioned normal to the jet axis. The fine etchant droplets or aerosols are carried by the expanding aerosol jet from the expansion nozzle to impinge upon the surface to be etched.

The AJE method is illustrated in FIGS. 2(a) through 2(d), as applied to a waver W prepared as explained for FIG. 1. In FIG. 2(b), etchant aerosols A are shown etching through the irradiated regions R of the polymer layer P. Despite a rather complicated gas flow pattern, the researchers of the AJE technique have performed a comprehensive hydrodynamic study of the technique. This study shows that the aerosol movement is reasonably perpendicular to outer surface F of polymer layer P, as indicated by arrow B.

In FIG. 2(c), the aerosol A is shown etching through the oxide layer X to form trough T, while the finished product is shown in FIG. 2(d). The etchant aerosols which impinge on the sidewalls of the trough T do not drain away. Some etchant aerosols cling to the trough sidewalls causing a certain degree of undercutting U although such undercutting is not as severe as that occurring with wet etching (compare FIGS. 1(d) and 2(d)). Furthermore, the surface tension of the aerosol restricts the etchant from spreading uniformly on the bottom surface of the trough T resulting in localized etching or pitting. Pitting produces a variety of undesirable effects on subsequent fabrication steps.

The AJE technique is impractical for processing large industrial wafers, which may be several inches in diameter. Processing of such a large wafer requires scanning the aerosol jet over the entire area of the surface to be etched. Such scanning produces nonuniform etching due to the conical spreading pattern of the aerosol jet.

For example, the direction of aerosol movement near the jet axis is substantially perpendicular to the surface of the specimen to be etched. However, the aerosols at the outer periphery of the aerosol jet impinge upon the surface to be etched at angles other than 90° which produces nonuniform etching. Thus, the AJE method is incapable of etching a large area at a uniform rate to produce uniform etching over the entire surface area, such as is required to etch a large industrial wafer.

Thus, a need exists for an improved etching system for producing integrated circuit wafers, and particularly for processing large industrial wafers, which is not susceptible to the above limitations and disadvantages.

SUMMARY OF THE INVENTION

It is an overall object of the present invention to provide an improved etching technique and system, including an improved device and method, for fabricating semiconductor wafers, such as for use in integrated circuits.

An additional object of the present invention is to provide an etching system having high selectivity and fine line anisotropic etching capabilities.

Still another object of the present invention is to provide an improved etching system which significantly reduces the risk of contamination to a semiconductor wafer during fabrication.

Yet another object of the present invention is to provide an improved etching system which produces a minimum of environmentally hazardous waste products.

A further object of the present invention is to provide an improved etching system which is economical to operate and capable of efficiently and rapidly processing several large industrial wafers simultaneously.

Another object of the present invention is to provide an improved etching system which minimizes undercutting in the semiconductor wafer during etching.

Another object of the present invention is to provide an improved etching system for producing fine line patterns in semiconductor wafers.

Still another object of the present invention is to provide an improved etching device which may be easily integrated into currently-existing semiconductor wafer-producing facilities.

According to one aspect of the present invention, an aerosol centrifuge etching device is provided for forming a fine line pattern on a wafer of a semiconductive material. The wafer has an etchable film layer with an outer surface being divided by masking into exposed etchable regions and masked nonetchable regions. The aerosol centrifuge etching device includes aerosol formation means for forming etchant aerosols of an etchant reactable with the etchable film layer. The device further includes centrifuge means for receiving the etchant aerosols and for uniformly accelerating the received etchant aerosols with a centrifugal force toward a target. The device also includes mounting means for mounting the wafer with the etchable film layer outer surface serving as the target so the etchant aerosols may impinge upon the outer surface and etch away the exposed regions of the etchable film layer. In this manner, an etched wafer is formed which has a fine line pattern as defined by the masking.

According to another aspect of the present invention, the aerosol centrifuge etching device includes feed chamber means for receiving the etchant vapor from an etchant vapor supply source. The feed chamber means has a rotation axis extending therethrough. The feed chamber means also has a feed chamber outlet. The device also includes a hollow centrifuge column extending outwardly from the feed chamber means. The column has a longitudinal axis substantially perpendicular to the rotation axis. The column also has opposing first and second ends, with the first end having an expansion nozzle in communication with the feed chamber outlet. The second end of the column has mounting means for mounting the wafer with the etchable film layer outer surface substantially perpendicular to the longitudinal axis. The device also has rotation means for rotating the centrifuge column about the rotation axis so as to provide a centrifugal force therein. The centrifugal force directs the etchant toward the column second end and along a path which is substantially parallel to the longitudinal axis of the centrifuge column.

To etch away the exposed regions of the etchable film layer, the etchant vapor travels from the feed chamber means through the feed chamber outlet and the expansion nozzle. The expansion nozzle converts the etchant vapor into a stream of extremely fine etchant aerosols. The stream of etchant aerosols enters the first end of the centrifuge column where the centrifugal force urges the stream of etchant aerosols into a column of narrowly-focused etchant aerosols. The column of etchant aerosols travels substantially parallel to the longitudinal axis to impinge at a substantially perpendicular angle upon the etchable film layer outer surface.

According to a further aspect of the present invention, a wafer etching system is provided having the ACE device described above. The system also includes etchant vapor source means for producing an etchant vapor which is supplied to the ACE device. During etching, reaction products are produced in the centrifuge means. The system also includes extraction means for extracting the reaction products from the centrifuge means.

According to yet another aspect of the present invention, an aerosol centrifuge etching method is provided for forming a fine line pattern on a semiconductive wafer having an etchable film layer with an outer surface being divided by masking into exposed regions and masked regions. The method includes the step of providing a rotating housing having a central region and a periphery with support means for releasably supporting the wafer with the etchable film layer outer surface facing the central region. The rotation of the housing provides a centrifugal force within the housing directed toward the periphery. The method also includes the step of mounting the wafer inside the rotating housing using the support means. In a feeding step, an etchant aerosol which is reactable with the etchable film layer, is fed into the central region of the rotating housing. In a propelling step, the received etchant aerosol is propelled outwardly by the centrifugal force from the central region to the periphery of the housing to impinge upon the etchable film layer outer surface of the mounted wafer. In an etching step, the exposed regions of the etchable film layer outer surface are etched by a chemical reaction of the impinged etchant aerosol and the etchable film layer. In this manner, an etched wafer is formed which has a fine line pattern as defined by the masking.

In an illustrated embodiment, the aerosol centrifuge etching device described above also includes means for mounting and simultaneously etching plural wafers, such as by providing plural centrifuge columns which receive an etchant aerosol via a single feed chamber means. When etchant aerosols are used which produce gaseous reaction products while etching away the exposed regions of the etchable film layer, the device may further include expulsion means for discharging the gaseous reaction products.

These and other objects, features and advantages of the present invention will become apparent to those skilled in the art from the following description and drawings.

BRIEF DESCRIPTION OF THE DRAWINGS

FIG. 3 is a sectional, partially schematic, elevational view of one form of an aerosol centrifuge etching device of the present invention;

DETAILED DESCRIPTION OF A PREFERRED EMBODIMENT

Figure 1:
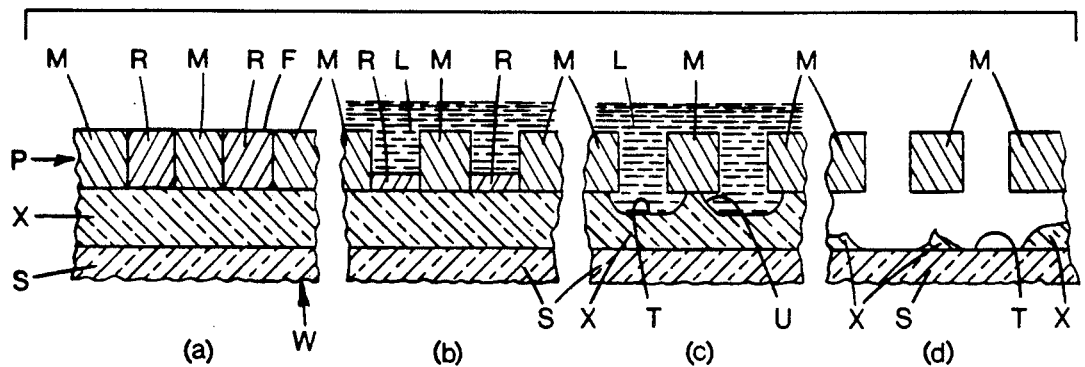
FIGS. 1 and 2, each having parts (a) through (d), illustrate earlier known methods of etching semiconductive wafers.

FIG. 3 illustrates a wafer etching system 9 having an aerosol centrifuge etching (ACE) device 10 in accordance with the present invention. The ACE device 10 includes a stationary housing 12 having a centrally located etchant supply reservoir or chamber 14 with an inlet 16. The wafer etching system 9 also includes an etchant vapor supply system or source 20. The etchant supply reservoir 14 receives a superheated etchant vapor V from the etchant vapor supply system 20.

While the etchant vapor supply system 20 is described as a system external to the ACE device 10, the etchant vapor supply system alternatively may be incorporated into the ACE device. In an alternative wafer etching system 9 (not shown) having a plurality of ACE devices, each ACE device 10 may receive a portion of the superheated etchant vapor V from a single etchant vapor supply system 20.

The etchant vapor supply system 20 includes etchant storage means, such as a tank 22, for storing an etchant E. The choice of etchant E depends upon the type of material which is desired to be etched. For example, a suitable etchant for etching wafers of a silicon dioxide layer over a silicon substrate layer is a mixture consisting essentially of hydrogen fluoride and nitric acid with buffered solutions.

The etchant E is released from tank 22 through line 24 at a desired pressure which is monitored by a pressure gauge 26. The etchant E may be mixed or diluted at a mixing valve 28 with a carrier gas G received from carrier gas storage means, such as a tank 30, via line 32. The pressure at which carrier gas G is released from tank 30 is monitored by a pressure gauge 33.

Suitable types of carrier gas G for use with the present invention include ultra clean air (free of particulate matter), or nitrogen. Although more expensive than nitrogen, inert gasses, such as argon, may also serve as the carrier gas G.

The mixture of etchant E and carrier gas G travels from the mixing valve 28 through line 34 to superheating means, such as a superheater 36. The etchant/carrier gas mixture has a characteristic saturation temperature. (The saturation temperature is the temperature at which vaporization takes place at a given pressure, which in turn is the saturation pressure for the given temperature. When the vapor temperature is greater than the saturation temperature, the vapor is superheated.) The temperature of the etchant/carrier gas mixture is elevated above the saturation temperature by the superheater 36 to produce the superheated etchant vapor V which is supplied via line 37 to the etchant supply reservoir inlet 16. The pressure and temperature of the superheated etchant vapor V produced by the superheater 36 may be monitored by respective pressure and temperature gauges 38 and 39 in line 37.

Control means, such as a microprocessor controller (not shown), may be included for controlling the mixture of the etchant E and carrier gas G, as well as the pressure and temperature of the superheated etchant vapor V produced by the etchant vapor supply system 20. The limits within which these variables are controlled will depend upon the implemented design of the ACE device 10, the type of wafer being etched, and the selection of the etchant E and carrier gas G. Thus, these parameters can readily be empirically determined if necessary.

Figure 4:
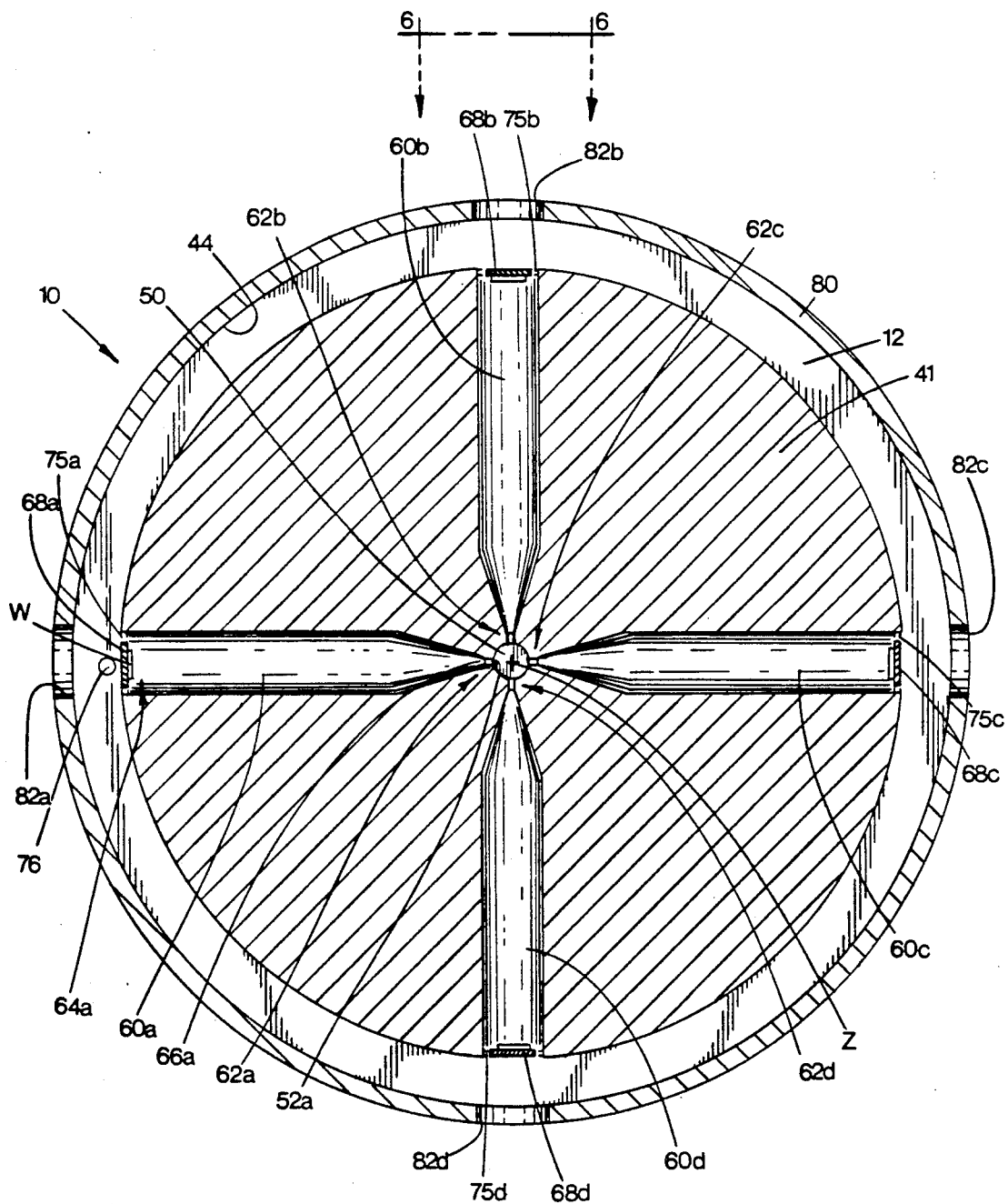
FIG. 4 is a slightly reduced cross-sectional view taken along lines 4—4 of FIG. 3.

Referring also to FIG. 4, the ACE device 10 includes centrifuge means, such as a centrifuge 40. The centrifuge 40 includes a rotating housing 41 driven by a central shaft 42. Conventional bearing means (not shown) rotatably mount rotating housing 41 within a gas discharge chamber 44 defined by stationary housing 12, thereby providing an enclosed environment for the rotatable housing 41. The centrifuge 40 includes a hub portion 45 projecting into the etchant supply chamber 14.

Rotation means (not shown) rotates the housing 41 about a rotation axis Z in a rotation path within the gas discharge chamber 44. The speed of rotation may be on the order of several thousand revolutions per minute. The speed of rotation may be controlled by control means (not shown) which may be separate from or integral with the control means controlling the etchant vapor supply system 20.

The ACE device 10 also includes first and second pressure sealing means, such as sealing rings 46 and 48. The first sealing ring 46 seals the hub portion 45 relative to stationary housing 12 between the etchant supply reservoir 14 and the gas discharge chamber 44. The second sealing ring 48 seals the shaft 42 between the gas discharge chamber 44 and atmosphere external to the gas discharge chamber. The sealing means 46 and 48 may be any type of sealing means for preventing the escape of a pressurized gas about a rotating shaft, such as porcelain sealing rings.

The centrifuge 40 has a partially hollow central region defining feed chamber means therein, such as a feed chamber 50, illustrated as being concentric around the rotational axis Z. The hub portion 45 is hollow and defines an inlet for feed chamber 50 from the etchant supply chamber 14. Thus, feed chamber 50 is in direct communication with chamber 14 to receive etchant vapor V therefrom. The feed chamber 50 includes at least one feed chamber outlet, such as outlets 52a, 52b and 52c (see FIG. 3).

The centrifuge 40 has passage means, such as at least one substantially radially extending passage or hollow condensation centrifuge column 60. In a preferred embodiment, the centrifuge 40 includes plural centrifuge columns, such as the four columns 60a, 60b, 60c and 60d each extending radially outward from the central feed chamber 50 (see FIG. 4). Each of the centrifuge columns has a longitudinal axis which is perpendicular to the centrifuge rotational axis Z. For example, while not critical to the operation of the device, the centrifuge columns 60a and 60c shown in FIG. 3 share a common longitudinal axis Y.

Using plural centrifuge columns advantageously allows for etching plural wafers simultaneously, in a manner described further below. Each of the columns 60a, 60b, 60c and 60d have identical features, which will be referred to by a single numeral designation hereinafter in the specification, whereas in the drawings, the suffix letters will be added to distinguish the columns as required.

Each centrifuge column 60 has opposing proximate and distal ends, 62 and 64, respectively. The centrifuge column proximate, first or inboard end 62 includes aerosol formation means for forming etchant aerosols, illustrated as expansion nozzle means, such as an expansion nozzle 66, for forming a stream of etchant aerosols over a dispersed cross sectional area. Nozzle 66 is in fluid communication with the feed chamber outlet 52 and the hollow interior of centrifuge column 60.

The distal, second or outboard end 64 of the centrifuge column 60 includes wafer mounting or support means for releasably mounting and supporting a prepared wafer W within the column. The wafer mounting means may include an insert or cartridge 68 (discussed further below) and retaining means (not shown) for receiving and releasably retaining the cartridge 68 at the column outboard end 64. The cartridge 68 mounts the wafer W with the polymer layer outer surface F facing toward the expansion nozzle 66. The wafer outer surface F is substantially perpendicular to the axis Y of column 60 to intercept the dispersed aerosols from nozzle 66.

During the etching reaction, reaction products which are predominantly gaseous and often volatile in nature, are produced in the centrifuge column 60. The wafer etching system 9 also includes vacuum-producing means, such as vacuum system 70, to assist in extracting the reaction products from column 60. The vacuum system 70 includes a condensation tank 72 within which a vacuum is created by a vacuum-creating blower 74.

The ACE device 10 includes gas discharge or expulsion means for removing the gaseous reaction products from the centrifuge column 60 and for discharging these reaction products. The expulsion means includes a centrifuge column outlet, such as vent hole 75, to vent the reaction products from column 60 to the gas discharge chamber 44. The expulsion means also includes the gas discharge chamber itself and an outlet 76 which serves to vent the reaction products from the discharge chamber 44.

The discharge chamber outlet 76 is in communication with the vacuum system 70 via a line 78. The blower 74 creates a vacuum via line 78 within the discharge chamber 44 to extract the reaction products from column 60. The reaction products are delivered from the discharge chamber outlet 76 to the condensation tank 72 via line 78 for subsequent condensation and removal from the tank 72.

The gas discharge chamber 44 includes an outer periphery 80 having access means therethrough, such as access port 82 which may be covered and sealed by a door (not shown). The mounting cartridge or support plate 68, with wafer W mounted thereto, may be positioned and placed within the outboard end 64 of the centrifuge column 60 through access port 82. The mounting and dismounting of cartridge 68 may be performed either manually or automatically using automated mounting means, such as by using a mechanical quick-joint method or a robotic arm assembly (not shown).

Figure 6:
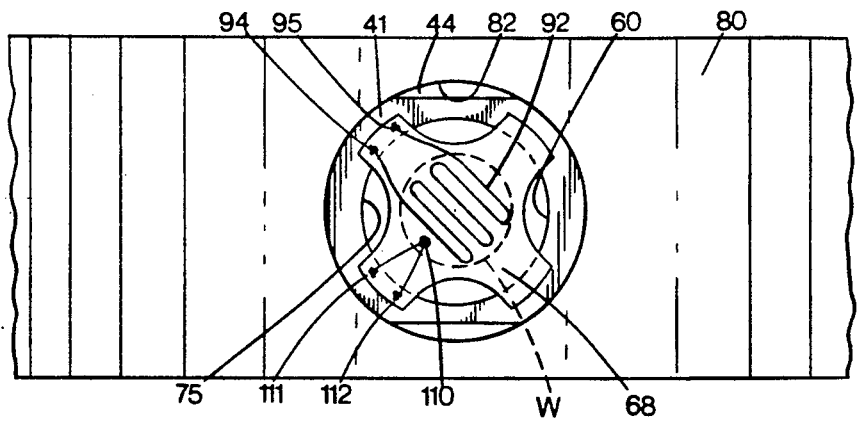
FIG. 6 is an enlarged partial, detailed elevational view taken along lines 6—6 of FIG. 4.
Figure 7:
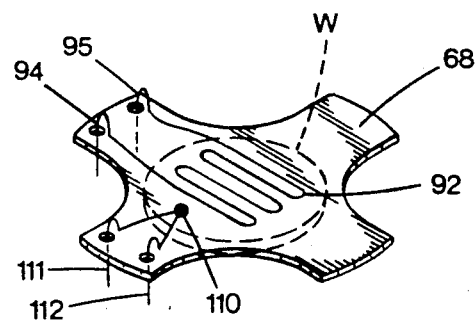
FIG. 7 is an enlarged perspective view of one form of a wafer mounting cartridge of the present invention.
Figure 8:
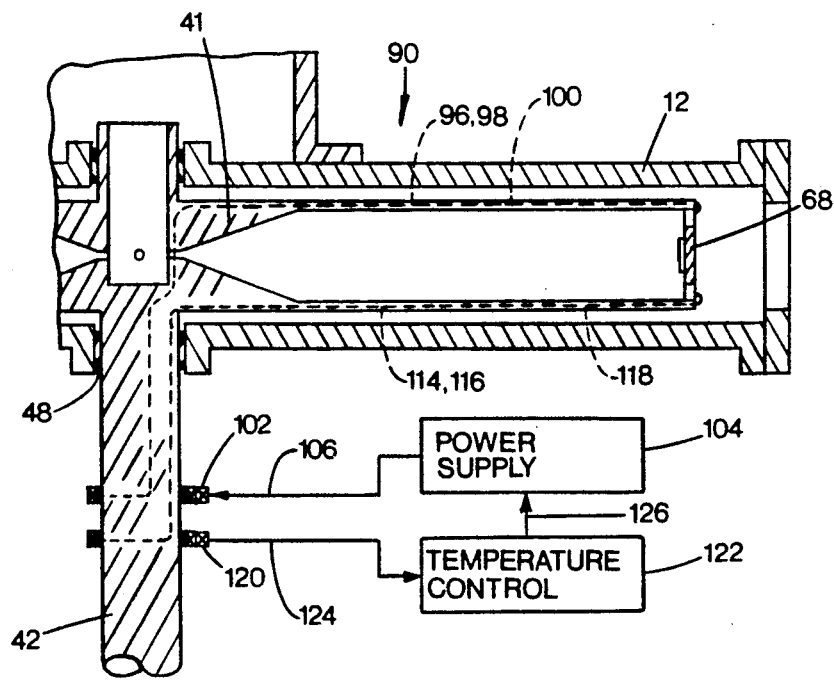
FIG. 8 is a partially schematic, partial, sectional elevational view of one form of a wafer heating system of the aerosol centrifuge etching device of the present invention.

Also during the etching reaction, the temperature of the etchable film layer is brought to a predetermined value to effect the chemical reaction of the etching step. Due to the volatile nature of the reaction products, this temperature is generally below 100° C., for example, in the range of 40°-70° C. FIGS. 6-8 illustrate one possible wafer heating system 90 for controlling the temperature of the etchable film layer during etching.

The illustrated wafer heating system 90 includes cartridge 68 having a heat source, such as a heating coil 92 mounted to a side of the cartridge 68 opposite the wafer W. The heating coil 92 has terminals 94 and 95, illustrated schematically, which may be electrically coupled with power wires 96 and 98. The power wires 96 and 98 run through a first cable track 100 within the rotating housing 41 and terminate at a power brush/slip ring assembly 102. The assembly 102 receives power from a power supply 104 via electrical cable 106.

The temperature of the etchable film layer is monitored by monitoring means, such as thermocouple 110 having thermocouple terminals 111 and 112, illustrated schematically. The thermocouple terminals 111 and 112 may be electrically coupled with thermocouple wires 114 and 116. The thermocouple wires 114 and 116 run through a second cable track 118 within the rotating housing 41 and terminate at a thermocouple brush/slip ring assembly 120.

To control the temperature of the etchable film layer to a desired value, temperature control means, such as temperature controller 122, may be employed. The thermocouple 110 generates a temperature feedback signal which is received by controller 122 from the slip ring assembly 120 via a feedback cable 124. The temperature controller 122 supplies a control signal to power supply 104 via a control signal cable 126 in response to the temperature feedback signal to maintain a desired temperature at the etchable film layer.

Figure 5:
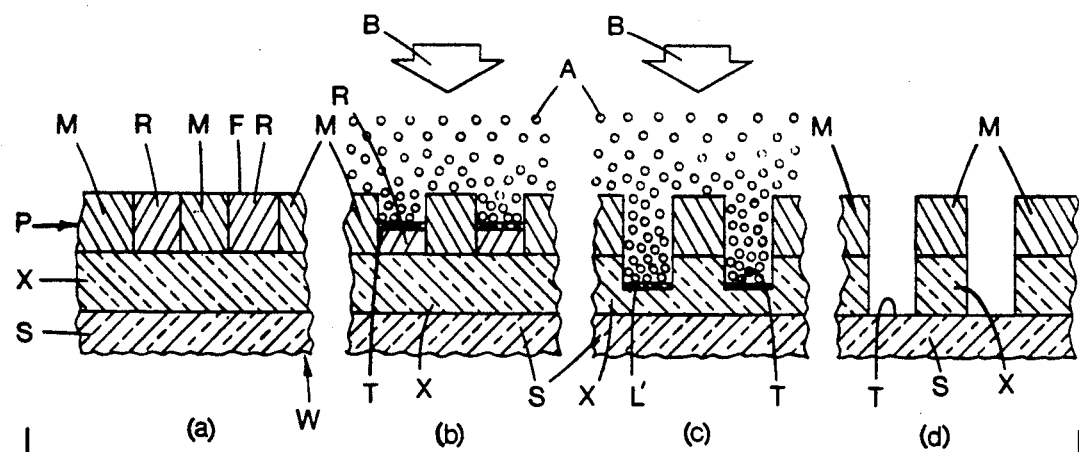
FIGS. 5(a) through 5(d) illustrate an etching process using the aerosol centrifuge etching device and method of the present invention.

In operation, the illustrated wafer etching system 9 operates to illustrate a method of forming a fine line pattern on a wafer of a semiconductor material. Referring to FIG. 5(a), a wafer W is prepared by placing an etchable oxide film layer X over a substrate layer S of a nonetchable semiconductive material. A polymer layer P of a selected polymer material is placed over the oxide layer X. Portions of the polymer layer P are masked with a mask (not shown) having a design corresponding to a desired fine line pattern.

The masked wafer is exposed to an ultraviolet (UV) light source. Upon exposure to UV light, the polymer material selected provides a polymer layer having a pattern of masked regions M and irradiated regions R in conformance with the mask. The masked regions M remain resistant to a chosen etchant, while the irradiated regions R become etchable after exposure to the UV light source. Thus, the irradiated regions R may be etched away upon exposure to the etchant, to expose the etchable oxide layer X therebeneath for etching.

The prepared wafer W is mounted to mounting cartridge 68 to form a wafer/cartridge assembly. The wafer/cartridge assembly is mounted to the outboard end 64 of centrifuge column 60 through axis port 82 in housing 12. The wafer W is mounted with the etchable film layer outer surface F perpendicular to the direction of the centrifugal force within centrifuge column, such as perpendicular to axis Y. The mounting may be preformed manually or automatically using the mechanical quick-joint described above.

For simultaneous etching, a plurality of masked wafers are mounted in the ACE device 10, with one wafer being mounted inside each column. All of the wafers are mounted prior to beginning an etching cycle and dismounted at the end of the cycle. Although FIG. 4 shows plural axis ports 82a through 82d, a single access port may be provided. In a single access port ACE device, the housing 41 is rotated incrementally to bring each of the centrifuge columns 60a through 60d into alignment with the single access port for mounting and dismounting the wafer/cartridge assemblies.

The etchant E, which may be in a vapor or a liquid state, is stored in tank 22 prior to preparation. The etchant E is diluted by mixing the etchant with carrier gas G from tank 30 via mixing valve 28. The pressures of the etchant E and carrier gas G may be monitored by respective gauges 26 and 32 and by regulated control means (not shown).

The etchant/carrier gas mixture is superheated by superheater 36 to a desired temperature above the saturation temperature of the mixture to form the superheated etchant vapor V. The etchant vapor V may be pressurized to a desired pressure by superheater 36. The temperature and pressure of the etchant vapor produced by superheater 36 may be monitored by thermometer 39 and pressure gauge 38, respectively. Alternatively, the pressure and temperature of the etchant vapor V may be monitored in the etchant supply reservoir 14.

The pressure and temperature of the etchant vapor V may be regulated by control means (not shown), responsive to the thermometer 39 and pressure gauge 36, for controlling superheater 36. The desired temperature and pressure may be regulated to preferably provide a superheated etchant vapor V in feed chamber 50 prior to entering nozzle 66, while accounting for losses, such as in line 37. Alternatively, the pressure may be regulated prior to entry into superheater 36, that is, using only valve 28 and gauges 26 and 33.

With the wafer W mounted as a target within centrifuge column 60 and the etchant vapor V prepared, the etching cycle may begin. The rotation means (not shown) rotates housing 41 via shaft 42 about the rotation axis Z to generate a centrifugal force in the centrifuge column 60. This centrifugal force is directed toward the column outboard end 64 and is substantially parallel with the longitudinal axis Y.

The pressurized superheated etchant vapor V is fed from superheater 36 through line 37, inlet 16 and into the etchant supply reservoir 14, through hub 45 and into the feed chamber 50. The etchant vapor is fed from the feed chamber outlet 52 into the inboard end 62 of column 60 through expansion nozzle 66. In the illustrated multi-column centrifuge 40, a portion of the etchant vapor is fed from the feed chamber 50 into each centrifuge column, such as 60a, 60b, 60c and 60d.

The expansion nozzle 66 adiabatically expands the pressurized etchant vapor V to bring the etchant vapor temperature down to a second temperature lower than the saturation temperature of the etchant vapor. This adiabatic expansion causes the pressurized etchant vapor to condense and form etchant aerosols A upon entry into the condensation centrifuge column 60. The expansion nozzle 66 also uniformly disperses the etchant aerosols over a cross sectional area which approximates the cross sectional area of the centrifuge column 60.

To assist the etchant aerosol formation, column 60 may have an internal temperature less than the saturation temperature which is characteristic of the particular etchant vapor. The column 60 may also have an internal pressure significantly lower than the pressure to which the etchant vapor has been raised by superheater 36 to further aid in condensation of the vapor into aerosols. In this manner, a stream of extremely fine etchant aerosols is formed at the column inboard end 62.

When rotating, the centrifuge 40 focuses the stream of etchant aerosols into a narrowly focused column traveling along a radial path substantially parallel to the longitudinal axis Y toward the target (wafer W). The centrifuge 40 centrifugally accelerates and propels the etchant aerosols A with the centrifugal force generated by the rotation means. The speed of rotation may be on the order of a few thousand revolutions per minute.

The etchant aerosols A are propelled from the central region to the periphery of housing 41 through column 60 to impinge on the target. With the wafer mounted so the outer surface F is substantially perpendicular to longitudinal axis Y, as described above, the propelled aerosols A impinge at a substantially perpendicular angle upon wafer outer surface F. The direction of the centrifugal force and path of aerosol travel relative to the wafer W is shown by arrow B in FIGS. 5(b) through 5(d).

Etching of the exposed regions of the wafer occurs through a chemical reaction of the impinged etchant aerosols A with the etchable film layer. For example, etching begins first through the irradiated regions R of the polymer layer P, then continues through portions of the oxide layer X which are beneath the irradiated regions R (see FIGS. 5(b) and 5(c)). The centrifugal acceleration forces the aerosols A to the bottom of a trough T being formed during the etching process, such that a small pool L' of liquid etchant is actually formed at the bottom of the trough T.

Figure 2:
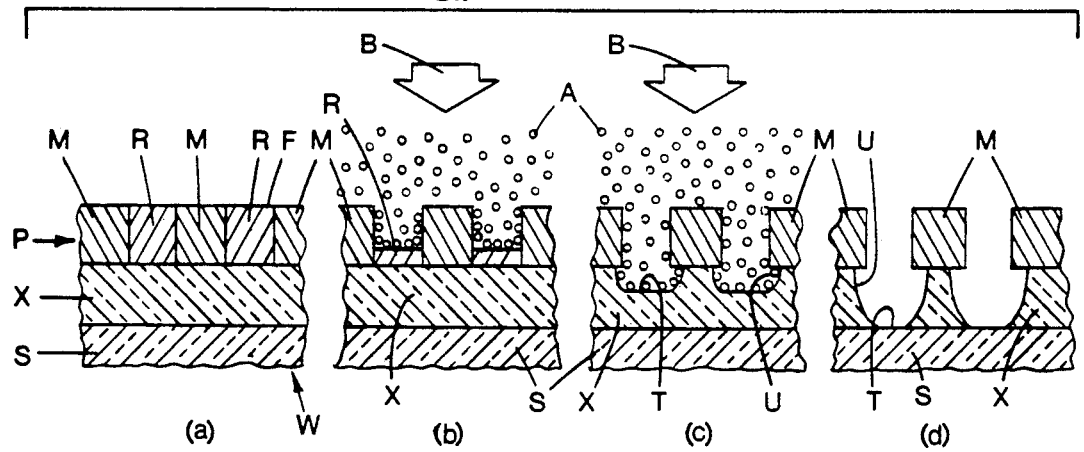

The sidewalls of trough T are only briefly exposed to the liquid etchant pool L' because the etchant rapidly burrows downward to form trough T under the influence of the centrifugal force. The speed imparted to the etchant process by the centrifugal acceleration forms trough sidewalls which are substantially vertical and in alignment with the masked regions M of the polymer layer P, as shown in FIG. 5(d). That is, the increased speed of the etching reaction does not allow the isotropic reaction of the aerosols to proceed against the sidewalls of the trough T. Thus, the undesirable undercutting, such as that illustrated by the earlier methods of FIGS. 1 and 2, is virtually eliminated.

To enhance the chemical reaction of the etching step, the temperature of the etchable film layer is elevated to a predetermined value. The predetermined temperature is typically below 100° C., for example, in the range of 40°-70° C. The etchable film layer temperature is controlled with the wafer heating system 90 A desired temperature of the etchable film layer is input by an operator or other control means to the temperature controller 122.

The thermocouple 110 monitors the temperature in an area adjacent the etchable film layer and provides the temperature controller 122 with a temperature feedback signal. In response to the desired temperature input and the temperature feedback signal, the temperature controller 122 supplies a control signal to the power supply 104. Temperature control is accomplished, for example, by the power supply increasing the power delivered to heating coil 92 to increase the temperature of the etchable film layer.

During the chemical reaction of etching, the reaction products produced are often toxic or dangerous to the environment. Advantageously, the wafer etching system 9 uses less etchant and produces a lesser quantity of reaction products than earlier etching systems, such as wet etching. Furthermore, the gaseous nature of the reaction products, and the closed system in which they are produced, facilitates the extraction and collection of the reaction products for subsequent disposal.

The gaseous reaction products are extracted and expelled from the centrifuge column 60 through the column vent hole 75 into the gas discharge chamber 44. To assist in discharging the gaseous reaction products from the column 60 and chamber 44, a vacuum blower 74 applies a vacuum to the chamber 44 via line 78. The volatile reaction products are removed from the gas discharge chamber 44 via outlet 76. The reaction products travel through line 78 to the condensation tank 72, where they are condensed from the gaseous state for subsequent disposal. If significant amounts of liquid etchant remain puddled in pool L' after etching, the cartridge 68 may be inverted upon dismounting to dump the pooled etchant from the wafer trough T.

During an etching cycle, the duration of the centrifuge 40 rotation and application of the etchant aerosol A may be monitored until a predetermined etching duration time is reached. The length of the etching cycle may be contingent upon various factors such as the type of aerosol, type of oxide layer and polymer layer, size of the components, speed of rotation, etc.

At the end of the etching cycle, the control means (not shown) may stop the centrifuge rotation and etchant aerosol application. The rotation of the centrifuge 40 may continue after the application of etchant aerosols A to the wafer W has stopped. The etched wafer, as shown in FIG. 5(d), is removed from the support 68 after reaching the predetermined etching time.

Thus, the ACE device 10 and the ACE technique or method for etching wafers overcomes many of the difficulties encountered in earlier etching techniques. For example, many of the drawbacks of the earlier wet etching techniques are eliminated through the use of the centrifugal force to deliver the etchant in an aerosol form to the wafer W. For example, the use of etchant aerosols instead of bulk etchant liquid permits the etching to proceed only along the bottom surface of trough T.

The ACE technique also overcomes shortcomings of the aerosol jet etching technique. For example, the aerosols in the ACE technique of the present invention are uniformly distributed over the bottom surface of the trough T by the strong centrifugal force. This provides uniform etching without pitting.

Additionally, the aerosols in the ACE technique impinge at an angle normal to the surface to be etched (when mounted as described above). This precise directionality of impingement, as opposed to the conical spreading pattern of the aerosol jet technique, ensures that only a minimum amount of aerosols impinge on the sidewalls of the trough T. Therefore, the ACE technique minimizes undercutting U (compare FIG. 2(d) and FIG. 5(d)). Moreover, the strong influence of the centrifugal force drives the etchant aerosol A immediately down to the bottom of the trough T so sidewall contact is minimized. One of the most important advantages of the ACE technique, from an applications point of view, is the capability to etch large wafers of industrial importance.

Having illustrated and described the principals of my invention with respect to a preferred embodiment, it should be apparent to those skilled in the art that my invention may be modified in arrangement and detail without departing from such principles. For example, other types of semiconductors and etchants may be used, as well as other polymer layers and methods of preparing the wafer W. Furthermore, plural rotating housings 41 may be aligned to share a common shaft 42 such that each rotates about axis Z. With an ACE device having plural rotating housings, a single feed chamber 50 may link and feed each rotating housing with the etchant vapor V. Alternatively, a wafer etching system 9 may include a plurality of ACE devices, each receiving the etchant vapor through a manifold assembly from a single supply system 20. Moreover, the etchant aerosols A may be generated elsewhere, outside of the centrifugal etching apparatus, and then introduced into the ACE device. In this embodiment, means are provided to stabilize, that is prevent coalescence of, the etchant aerosols A during transfer to the centrifuge 40. In such a case, the expansion nozzle 66 may be omitted. I claim all such modifications falling within the scope and spirit of the following claims.

I claim:

1. An aerosol centrifuge etching device for forming a fine line pattern on a wafer of a semiconductive material having an etchable film layer with an outer surface being divided by masking into exposed etchable regions and masked nonetchable regions, the aerosol centrifuge etching device comprising:

aerosol formation means for forming etchant aerosols of an etchant reactable with the etchable film layer;

centrifuge means for receiving the etchant aerosols and for uniformly accelerating the received etchant aerosols with a centrifugal force toward a target; and mounting means for mounting the wafer with the etchable film layer outer surface serving as the target so the etchant aerosols may impinge upon the outer surface and etch away the exposed regions of the etchable film layer, thereby forming an etched wafer having a fine line pattern as defined by the masking.

2. An aerosol centrifuge etching device according to claim 1 wherein:

the centrifuge means focuses the etchant aerosols into a narrowly focused column traveling along a radial path toward the target; and the mounting means mounts the wafer with the etchable film layer outer surface substantially perpendicular to the radial path.

3. An aerosol centrifuge etching device according to claim 1 wherein:

the etchant-aerosols produce gaseous reaction products while etching away the exposed regions of the etchable film layer; and the device further includes expulsion means for discharging the gaseous reaction products.

4. An aerosol centrifuge etching device according to claim 1 wherein:

the centrifuge means includes nozzle means for forming a stream of etchant aerosols over a dispersed cross sectional area; and the centrifuge means forces the dispersed etchant aerosols to impinge upon an area of the etchable film layer outer surface substantially equal to the dispersed cross sectional area.

5. An aerosol centrifuge etching device for forming a fine line pattern on a wafer of a semiconductive material having a base layer and an etchable film layer with an outer surface, the etchable layer outer surface being divided by masking into exposed etchable regions and masked nonetchable regions, the aerosol centrifuge etching device comprising:

feed chamber means for receiving an etchant vapor reactable with the etchable film layer from an etchant vapor supply source, the feed chamber means having a rotation axis extending therethrough and having a feed chamber outlet;

a hollow centrifuge column extending outwardly from the feed chamber means, the column having a longitudinal axis substantially perpendicular to the rotation axis, the column also having opposing first and second ends, with the first end having an expansion nozzle in communication with the feed chamber outlet, and the second end having mounting means for mounting the wafer with the etchable film layer outer surface facing the first end and being substantially perpendicular to the longitudinal axis; and rotation means for rotating the centrifuge column about the rotation axis so as to provide a centrifugal force therein directed toward the second end and substantially parallel with the longitudinal axis, whereby the etchant vapor travels from the feed chamber means through the feed chamber outlet and the expansion nozzle, the expansion nozzle converts the etchant vapor into a stream of extremely fine etchant aerosols from the etchant vapor, the stream of etchant aerosols enters the first end of the centrifuge column where the centrifugal force urges the stream of etchant aerosols into a column of narrowly focused etchant aerosols traveling along a path which is substantially parallel to the longitudinal axis to impinge at a substantially perpendicular angle upon the etchable film layer outer surface to etch away the exposed regions of the etchable film layer.

6. An aerosol centrifuge etching device according to claim 5 wherein:

the etchant vapor has a characteristic saturation temperature and is received from the etchant vapor supply source at a superheated first temperature above the saturation temperature and at an elevated first pressure;

the expansion nozzle serves to adiabatically expand the etchant vapor to bring the etchant vapor temperature to a second temperature lower than the saturation temperature of the etchant vapor; and the hollow centrifuge column comprises a condensation centrifuge column having an internal temperature less than the saturation temperature of the etchant vapor, the condensation centrifuge column also having an internal pressure significantly lower than elevated first pressure, whereby the etchant vapor condenses upon entering the condensation centrifuge column to form the etchant aerosols.

7. An aerosol centrifuge etching device according to claim 5 wherein:

the etchant aerosols produce reaction products while etching away the exposed regions of the etchable film layer;

the centrifuge column has a centrifuge column outlet at the second end; and the device further includes gas discharge means in communication with the centrifuge column outlet for removing the reaction products from the centrifuge column.

8. An aerosol centrifuge etching device according to claim 7 wherein:

the rotation means rotates the centrifuge column in a rotation path about the rotation axis; and the gas discharge means comprises a gas discharge chamber surrounding the rotation path of the centrifuge column, the atmosphere within the gas discharge chamber being at a vacuum to extract the reaction products from the centrifuge column.

9. An aerosol centrifuge etching device according to claim 5 wherein:

the rotation means rotates the centrifuge column in a rotation path about the rotation axis; the centrifuge column has a centrifuge column outlet at the second end;

the device further includes a stationary gas discharge chamber surrounding the rotation path of the centrifuge column; and the feed chamber means comprises a stationary etchant supply reservoir which receives the etchant vapor from the etchant vapor supply source, and a central feed chamber located about the rotational axis and rotationally connected to the stationary etchant supply reservoir and the stationary gas discharge chamber, the central feed chamber being in communication with the etchant supply reservoir and the expansion nozzle.

10. An aerosol centrifuge etching device according to claim 9 further including plural centrifuge columns extending radially outward from the central feed chamber, whereby plural wafers may be etched simultaneously.

11. An aerosol centrifuge etching method of forming a fine line pattern on a wafer of a semiconductive material having an etchable film layer with an outer surface being divided by masking into exposed etchable regions and masked nonetchable regions, the aerosol centrifuge etching method comprising the steps of:

providing a rotating housing having a central region and a periphery with support means for releasably supporting the wafer with the etchable film layer outer surface facing the central region, the rotation of the housing providing a centrifugal force within the housing directed toward the periphery;

mounting the wafer inside the rotating housing using the support means;

feeding an etchant aerosol which is reactable with the etchable film layer into the central region of the rotating housing;

propelling the received etchant aerosols outwardly with the centrifugal force from the central region to the periphery of the housing to impinge on the etchable film layer outer surface of the mounted wafer; and etching the exposed regions of the etchable film layer outer surface by a chemical reaction of the impinged etchant aerosol and the etchable film layer, thereby forming an etched wafer having a fine line pattern as defined by the masking.

12. An aerosol centrifuge etching method according to claim 11 wherein:

the method further includes the step of elevating the temperature of the etchable film layer to a predetermined value to effect the chemical reaction of the etching step;

the etching step includes the step of producing gaseous reaction products during the chemical reaction;

the providing step comprises the step of providing the rotating housing with the periphery also having a vent hole therethrough; and the method further comprises the step of expelling the gaseous reaction products through the vent hole.

13. An aerosol centrifuge etching method according to claim 11 for simultaneously etching a plurality of masked wafers wherein:

the providing step comprises the step of providing the rotating housing with a plurality of hollow columns, with each column extending from the central region to the periphery of the housing and having opposing central and peripheral ends, each column having a support means mounted therein at the peripheral end, the housing also having a central feed chamber in communication with the central end of each column;

the mounting step comprises the steps of mounting plural wafers with one wafer inside each column using the support means;

the feeding step comprises the steps of feeding a portion of the etchant aerosol through the feed chamber and into the each column;

the propelling step comprises the steps of propelling the received portion of the etchant aerosol with the centrifugal force through each column toward the peripheral end to impinge on the etchable film layer outer surface of the wafer mounted therein, thereby forming a plurality of etched wafers each having a fine line pattern as defined by the masking on said each wafer.

14. An aerosol centrifuge etching method of forming a fine line pattern on a wafer of a semiconductive material having an etchable film layer with an outer surface being divided by masking into exposed regions and masked regions, the aerosol centrifuge etching method comprising the steps of:

providing a hollow centrifuge column having proximate and distal ends, with the distal end extending outwardly from a rotational axis and having support means for releasably supporting the wafer with the etchable film layer outer surface facing the proximate end, the proximate end having inlet means, and rotation means for rotating the centrifuge column about the rotational axis;

mounting the wafer inside the centrifuge column using the support means;

preparing an etchant which is reactable with the etchable film layer;

feeding the etchant to the centrifuge column proximate end inlet means;

rotating the Centrifuge column with the rotation means to produce a centrifugal force within the centrifuge column directed toward the distal end;

centrifugally accelerating the etchant received through the inlet means with the centrifugal force along the centrifuge column to impinge on the etchable film layer outer surface of the mounted wafer; and etching the exposed regions of the etchable film layer outer surface by a chemical reaction of the etchant and the etchable film layer, thereby forming an etched wafer having a fine line pattern as defined by the masking.

15. An aerosol centrifuge etching method according to claim 14 wherein:

the etchant is an etchant vapor having a characteristic saturation temperature;

the preparing step comprises the steps of superheating the etchant vapor to a superheated first temperature above the saturation temperature, and pressurizing the etchant vapor to an elevated first pressure;

the feeding step comprises the step of adiabatically expanding the pressurized etchant vapor upon entry into the centrifuge column to bring the etchant vapor temperature to a second temperature lower than the characteristic saturation temperature of the etchant vapor;

the method further includes the step of condensing the etchant vapor upon entry into the centrifuge column by providing an internal temperature within the centrifuge column less than the characteristic saturation temperature of the etchant vapor to form etchant aerosols;

the accelerating step comprises the step of accelerating the etchant aerosols; and the etching step comprises the step of etching the exposed regions of the etchable film layer outer surface by a chemical reaction of the etchant aerosols and the etchable film layer.

16. An aerosol centrifuge etching method according to claim 15 wherein the preparing step further comprises the step of diluting the etchant vapor with a carrier gas prior to the superheating step.

17. An aerosol centrifuge etching method according to claim 15, wherein:

the providing step comprises the steps of providing an etchant supply reservoir which receives the superheated pressurized etchant vapor from an etchant vapor supply source, and providing a rotating feed chamber about the rotational axis and rotated by the rotation means, the feed chamber in communication with the etchant supply reservoir and the centrifuge column; and the method further including the steps of regulating the etchant vapor pressure and temperature within the feed chamber by adjusting etchant vapor pressure and temperature in the etchant supply reservoir.

18. An aerosol centrifuge etching method according to claim 14 further including the steps of:

regulating the temperature of the etchable film layer to a predetermined value prior to etching;

monitoring the duration of the accelerating step until a predetermined etching duration time is reached; and removing the etched wafer from the support means after reaching the predetermined etching duration time.

19. An aerosol centrifuge etching method according to claim 18 wherein:

the mounting step comprises the step of using automated means for mounting the wafer; and the removing step comprises the step of using automated means for removing the etched wafer.

20. An aerosol centrifuge etching method according to claim 14 wherein the providing step comprises the step of providing plural hollow centrifuge columns each extending outwardly from the rotational axis and rotatable by rotation means about the rotational axis.

21. An aerosol centrifuge etching method according to claim 14 wherein:

the etching step comprises the step of producing gaseous reaction products during the chemical reaction; and the method further includes the step of extracting the gaseous reaction products from the centrifuge column.

22. An aerosol centrifuge etching method according to claim 14 wherein the mounting step comprises the step of mounting the etchable film layer outer surface of the wafer perpendicular to the direction of the centrifugal force within centrifuge column.

23. A wafer etching system for forming a fine line pattern on a wafer of a semiconductive material having an etchable film layer with an outer surface being divided by masking into exposed etchable regions and masked nonetchable regions, the system comprising:

etchant vapor source means for producing an etchant vapor of an etchant reactable with the etchable film layer;

aerosol formation means for receiving the etchant vapor from the etchant vapor source means and for forming etchant aerosols from the etchant vapor;

centrifuge means for receiving the etchant aerosols and for uniformly accelerating the received etchant aerosols with a centrifugal force toward a target;

mounting means for mounting the wafer with the etchable film layer outer surface serving as the target so the etchant aerosols may impinge upon the outer surface and etch away the exposed regions of the etchable film layer, with reaction products being produced in the centrifuge means during the etching; and extraction means for extracting the reaction products from the centrifuge means.

24. A wafer etching system according to claim 23 wherein the etchant vapor source means includes:

means mixing an etchant with a carrier gas to form an etchant mixture;

means for forming the etchant vapor from the etchant mixture; and means for superheating and pressurizing the etchant vapor.

25. A wafer etching system according to claim 23 wherein the extraction means includes:

vacuum means for applying a vacuum to the centrifuge means; and condensation means for gathering the reaction products for disposal.

26. A wafer etching system for forming a fine line pattern on a wafer having an etchable film layer surface divided into exposed etchable regions and masked nonetchable regions, the system comprising:

etchant source means for supplying an etchant reactable with the etchable film layer;

rotatable housing means having an axis of rotation, a periphery, and a central chamber for receiving the etchant supplied by the etchant source means;

mounting means for removably mounting at least one wafer at the periphery of the rotatable housing means with the etchable film layer surface facing radially inwardly toward the central chamber;

passage means for providing a substantially radially extending passage between the central chamber and each wafer mounted at the periphery of the rotatable housing means; and rotation means for rotating the rotatable housing means about the axis of rotation to cause the etchant in the central chamber to travel radially outwardly by centrifugal force through the passage means and impinge upon each etchable film layer surface.

27. A wafer etching system according to claim 26 wherein said etchant source means supplies an etchant in vapor form to the central chamber, and wherein the wafer etching system further includes nozzle means disposed between and in fluid communication with the central chamber and the passage means to facilitate adiabatic expansion of the etchant vapor and resulting condensation of the etchant vapor into aerosol form as the etchant vapor enters the passage means, whereby the etchant aerosol travels radially outwardly by centrifugal force through the passage means and impinges upon each etchable film layer surface.

28. A wafer etching system according to claim 27 further including stationary housing means surrounding the rotatable housing means to provide an enclosed environment for the rotatable housing means.

29. A method of forming a fine line pattern on a wafer having an etchable film layer surface divided into exposed etchable regions and masked nonetchable regions, the method comprising:

supplying an etchant vapor reactable with the etchable film layer to a central chamber of a rotatable housing;

rotating the rotatable housing to cause the etchant vapor to travel radially outwardly under the influence of centrifugal force;

thereafter passing the etchant vapor through at least one nozzle to facilitate adiabatic expansion thereof and thereby convert the etchant vapor into etchant aerosols;

thereafter passing the etchant aerosols through at least one passage extending substantially radially from the central chamber to focus the etchant aerosols into an etchant aerosol stream traveling substantially radially outward; and positioning one wafer at a distal end of each passage, with the etchable film layer surface facing radially inward, such that the etchable film layer surface serves as a target for the etchant aerosol stream in the passage.

* * * * *